(12) United States Patent
Paul

(10) Patent No.: US 12,355,398 B2
(45) Date of Patent: Jul. 8, 2025

(54) REDUCING TARGET FREQUENCY VARIATION IN OSCILLATOR

(71) Applicant: Texas Instruments Incorporated, Dallas, TX (US)

(72) Inventor: Animesh Paul, Bangalore (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 24 days.

(21) Appl. No.: 18/072,676

(22) Filed: Nov. 30, 2022

(65) Prior Publication Data

US 2024/0136975 A1 Apr. 25, 2024

Related U.S. Application Data

(60) Provisional application No. 63/418,677, filed on Oct. 24, 2022.

(51) Int. Cl.
*H03B 5/04* (2006.01)
*H03B 5/24* (2006.01)

(52) U.S. Cl.
CPC ............... *H03B 5/04* (2013.01); *H03B 5/24* (2013.01)

(58) Field of Classification Search
CPC ........................................... H03B 5/04
USPC ...................................... 331/108 C
See application file for complete search history.

(56) References Cited

U.S. PATENT DOCUMENTS

2021/0111726 A1* 4/2021 Jang .................. G05F 1/59

* cited by examiner

*Primary Examiner* — Joseph Chang
(74) *Attorney, Agent, or Firm* — Xianghui Huang; Frank D. Cimino

(57) ABSTRACT

An integrated circuit, with an error amplifier having a first input, a second input, and an output, a voltage controlled oscillator having an input coupled to the output of the error amplifier, a feedback controlled voltage stage having at least one control coupled to the output of the error amplifier and an output coupled to the first input of the error amplifier, and an adaptive-reference voltage stage coupled to the second input of the error amplifier.

20 Claims, 2 Drawing Sheets

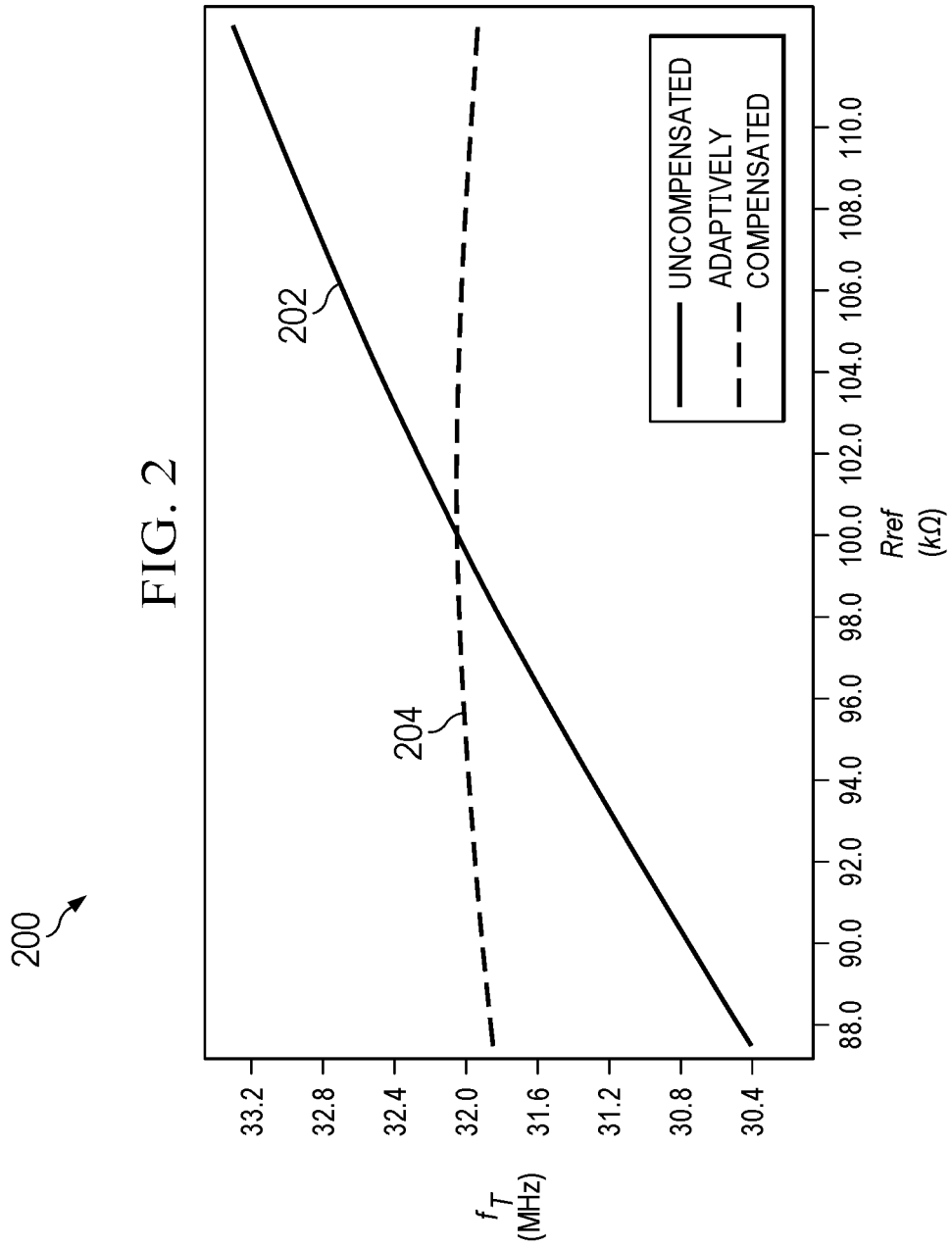

REDUCING TARGET FREQUENCY VARIATION IN OSCILLATOR

CROSS-REFERENCE TO RELATED APPLICATION

This application claims the benefit of and priority to U.S. Provisional Patent Application No. 63/418,677 filed Oct. 24, 2022, which is hereby fully incorporated herein by reference.

BACKGROUND

The described examples relate to integrated circuits (singular IC, plural, ICs) and more particularly to IC oscillators.

ICs are widely implemented in numerous devices, for various applications, including as examples: industrial automation, consumer electronics, automotive control, and still others. These devices, and applications, provide a wide variety of design considerations. An IC may require some type of timing signal, which for example may be generated by an oscillator that is sometimes also referred to as a clock. Some ICs include the oscillator internally, and the oscillator typically converts a DC voltage of the IC to an AC signal having a desired oscillator frequency. The oscillator frequency may be controlled by one or more passive devices, for example including a resistor or resistor network that provide a frequency-controlling resistance, and possibly a capacitor or switched capacitance. Certain factors, however, may undesirably influence the frequency-controlling resistance and likewise the oscillator frequency. For example, such resistance-affecting factors include any one or more of IC temperature, package stress, and age.

Examples are provided in this document that may improve on various of the above considerations as well as other concepts, as further detailed below.

SUMMARY

In one example, there is an integrated circuit, comprising an error amplifier having a first input, a second input, and an output, a voltage controlled oscillator having an input coupled to the output of the error amplifier, a feedback controlled voltage stage having at least one control coupled to the output of the error amplifier and an output coupled to the first input of the error amplifier, and an adaptive-reference voltage stage coupled to the second input of the error amplifier.

Other aspects are also disclosed and claimed.

BRIEF DESCRIPTION OF THE DRAWINGS

FIG. 2 is a simulation graph representing an example of potential improvement by the FIG. 1 oscillator configuration.

DETAILED DESCRIPTION

Figure 1:
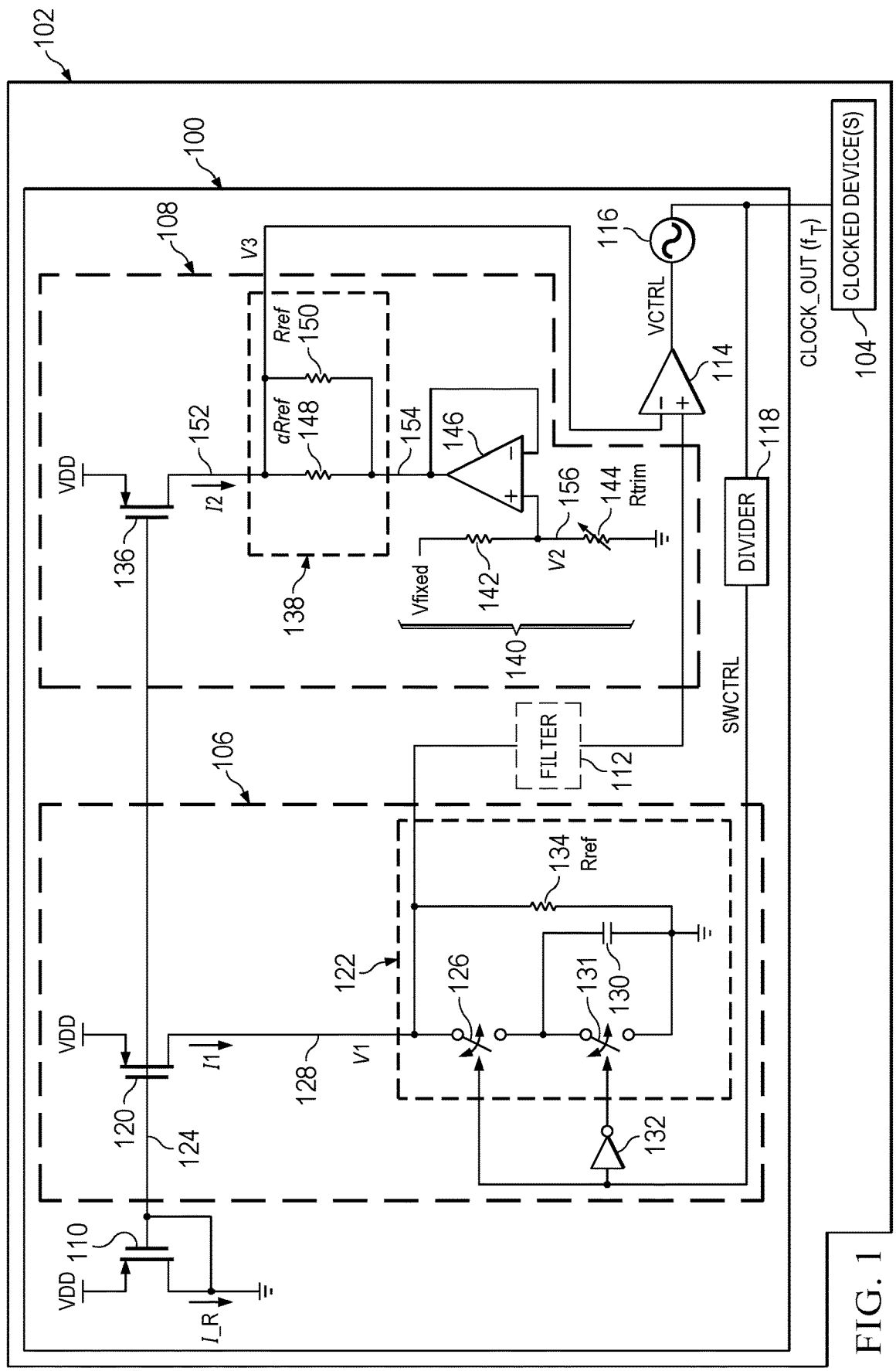
FIG. 1 is an electrical diagram of an oscillator configuration.

FIG. 1 is an electrical diagram of an oscillator configuration 100. The oscillator configuration 100 may be formed, for example, internally within an IC 102. The oscillator configuration 100 is adapted to receive, and be powered by, a bias voltage VDD, either provided to or generated by the IC 102. In response to VDD, the oscillator configuration 100 provides an output clock signal, CLOCK_OUT. CLOCK_OUT may be used to clock one or more clocked devices 104 also within the IC 102, and the clocked devices 104 may be of various types or forms based on the IC 102 specifications and functionality.

Generally, the oscillator configuration 100 includes a feedback-controlled voltage stage 106 and an adaptive-reference voltage stage 108. A current mirror reference transistor 110, for example a metal-oxide-semiconductor field effect transistor (MOSFET), has a source connected to VDD, a drain connected to ground and to its gate, and its gate further coupled to each of the stages 106 and 108. In the example, current mirror reference transistor 110 is a PMOS transistor. Given a mirroring connectivity (e.g., common gate-to-source voltage) of the current mirror reference transistor 110 to the stages 106 and 108 as further detailed below, the relatively stable drain reference current I_R of the current mirror reference transistor 110 can be mirrored, at a same or proportional level, in each of the stages 106 and 108. The feedback-controlled voltage stage 106 outputs a voltage V1, which may be coupled directly, or through an optional filter 112 (shown in dotted lines as optional and to reduce any noise or potential jitter in V1), to a non-inverting input of an error amplifier 114. The adaptive-reference voltage stage 108 provides outputs an adaptable voltage V3 to an inverting input of the error amplifier 114. The output of the error amplifier 114 provides a control voltage, VCTRL, to a voltage controlled oscillator (VCO) 116. The output of the VCO 116 provides CLOCK_OUT, and it is also fed back through a divider 118. The divider 118 may divide the period of CLOCK_OUT by any desired value, and it is typically triggered only once per period (for example, on a rising transition), so that the divider 118 output has a 50% duty cycle, whereas the CLOCK_OUT signal may depart from such a duty cycle. Further, the divider 118 output provides a switch control signal SWCTRL to the feedback-controlled voltage stage 106, as further detailed below.

The feedback-controlled voltage stage 106 includes a first MOS transistor 120 (e.g., PMOS) and a switched resistor network 122. The source of the first MOS transistor 120 is connected to VDD, and the gate of the first MOS transistor 120 is connected to a first node 124, which is also connected to the gate of the current mirror reference transistor 110. The switched resistor network 122 includes a first switch 126 with a first terminal connected to a second node 128, which is connected to the drain of the first MOS transistor 120. For later reference, the current provided by the drain of the first MOS transistor 120 to the node 128 is referred to as I1. A second terminal of the first switch 126 is connected to a first plate of a capacitor 130. A second plate of the capacitor 130 is connected to ground. The first plate of the capacitor 130 is also connected to a first terminal of a second switch 131, and the second terminal of the second switch 131 is connected to ground. Further, the first and second switches 126 and 131 are switched in complementary (one on at a time) fashion, by the control signal SWCTRL, to cyclically charge and discharge the capacitor 130, thereby creating a frequency-controlled equivalent impedance. In an example, the complementary switching is achieved by coupling SWCTRL to directly control the first switch 126, and to pass SWCTRL through an inverter 132 to control the second switch 131. Other configurations of switched resistance also may be implemented. The switched resistor network 122 also includes a first resistor 134, having a reference resistance Rref, connected between the second node 128 and ground. Accordingly, the parallel combination of the first resistor 134, and the switched resistance of the first and second switches 126 and 131 and the capacitor 130, provide an overall frequency-controlled resistance for the switched resistor network 122. The second node 128, and accordingly V1, is also connected to the non-inverting input of the error amplifier 114.

The adaptive-reference voltage stage 108 includes a second MOS transistor 136 (e.g., PMOS), a first parallel resistance network 138, a voltage divider 140 with a third resistor 142 and a variable resistor 144, and a buffer 146 (e.g., a high input impedance operational amplifier). The source of the second MOS transistor 136 is connected to VDD, and the gate of the second MOS transistor 136 is connected to the first node 124. The first parallel resistance network 138 includes a fourth resistor 148 and a fifth resistor 150, each connected between a third node 152, which is connected to the drain of the second MOS transistor 136, and a fourth node 154. The fifth resistor 150 has a resistance Rref, that is, matched to the first resistor 134. The fifth resistor 150 also may have other like characteristics matched with those of the first resistor 134, so that in a manner that the first resistor 134 is influenced by a resistance-impacting factor(s), then the fifth resistor 150 will be comparably influenced. The fourth resistor 148 has a resistance αRref, that is, the resistance of the fifth resistor 150 (Rref) times a value α, which is selected as detailed later and to adapt the voltage V3 in response to effects in V1, at the feedback-controlled voltage stage 106. The fourth node 154 is connected to both the output and inverting input of the buffer 146. A first terminal of the third resistor 142 is connected to receive a fixed voltage Vfixed, which for example may be provided from a stable voltage source provided by the IC 102, such as a reference band gap voltage. A second terminal of the third resistor 142 is connected to a fifth node 156. The fifth node 156 is also connected to the non-inverting input of the buffer 146. A first terminal of the variable resistor 144 is connected to the fifth node 156, and a second terminal of the variable resistor 144 is connected to ground. For later reference, the voltage at the fifth node 156 is referred to as V2, the current provided by the drain of the second MOS transistor 136 is referred to as I2, and the voltage at the third node 152 is referred to as V3.

The operation of oscillator configuration 100 is first described generally. The error amplifier 114 outputs the voltage VCTRL to control the oscillator 116 to cycle CLOCK_OUT at a target frequency, $f_T$. As an example, $f_T$=32 MHz. More particularly, the adaptive-reference voltage stage 108 outputs an adaptable reference voltage, V3, while the feedback-controlled voltage stage 106 outputs a frequency-dependent voltage V1. In a nominal sense, the output of the error amplifier 114 modulates toward a steady state, at which state there is zero difference (no error) between the voltages V1 and V3 at its respective non-inverting and inverting inputs. Thus, to the extent that V3 is a fixed reference voltage, then any differential error between the voltages V1 and V3 is zeroed by the feedback of CLOCK_OUT, through the divider 118 to the switched resistor network 122. In other words, if the frequency of CLOCK_OUT departs from $f_T$ to a non-target frequency of $f_{NT}$, then $f_{NT}$ controls the first and second switches 126 and 131 to alternatively switch and thereby adjust the equivalent impedance along the switched path between the second node 128 and ground, and that equivalent impedance is in parallel with the Rref resistance of the first resistor 134, thereby adjusting the total parallel impedance and, correspondingly, the value of V1. For example, if $f_{NT}$>$f_T$, then the equivalent impedance along the switched path is reduced, likewise reducing the total impedance of the switched resistor network 122, thereby lowering V1 and decreasing $f_{NT}$ toward $f_T$. Alternatively, if $f_{NT}$<$f_T$, then the equivalent impedance along the switched path is increased, likewise increasing the total impedance of the switched resistor network 122, thereby raising V1 and increasing $f_{NT}$ toward $f_T$.

The preceding describes the nominal instance where V3 is a fixed reference voltage and from feedback control that adjusts a resistance that includes Rref of the first resistor 134; however, in non-ideal situations, resistance-impacting factors, for example any one or more of temperature, aging, and packaging stress, may affect the resistance Rref of the first resistor 134, so that the intended feedback control toward $f_T$ is impacted not only due to a differential voltage based on comparison to a reference, but also due to non-ideal resistance degradation in Rref. Accordingly, the oscillator nominal performance can be reduced, that is with the oscillator configuration 100 producing an output frequency other than $f_T$, due to such resistance-impacting factors. As further detailed below, V3 from the adaptive-reference voltage stage 108 reacts comparably to those resistance-impacting factors, so that to the extent such factors influence V1, then V3 is comparably influenced, that is, any change in V1 is approximately the same in (or tracked by) V3. In this sense, the adaptive-reference voltage stage 108 adapts V3, to compensate for comparable changes in V1, rather than providing a fixed voltage or one that may depart in a different or unintended manner from V1. Accordingly, with the adaptability of the adaptive-reference voltage stage 108, any difference between V1 and V3 approaches the nominal scenario, that is, reducing any effect from those resistance-impacting factors and leaving the difference between V1 and V3 to control the CLOCK_OUT frequency toward $f_T$.

In the adaptive-reference voltage stage 108, V3 is impacted by V2 at the fifth node 156 and the voltage V3 added to it at the fourth node 154. Further, V3 is impacted by the current I2 through the total resistance of the first parallel resistance network 138, and that total resistance is determined by Rref of the fifth resistor 150 and αRref of the fourth resistor 148. In an example, V2 can be trimmed by adjusting the variable resistor 144, and the selection of αRref can be made, both by one skilled in the art given the present teachings, for example with the description provided below.

Given the preceding, the oscillator configuration 100 adapts V3 via the adaptive-reference voltage stage 108, so that a deviation of V1 is matched by a deviation in V3. Mathematically, the deviation in V3 can be indicated as ΔV3, so that the total voltage at the third node 152 is V3+ΔV3. Similarly and mathematically, the deviation in V1 can be indicated as ΔV1, so that the total voltage at the second node 128 is V1+ΔV1. The adaptability of oscillator configuration 100 can be thusly mathematically characterized in attempting to ensure that ΔV1=ΔV3, as further demonstrated below.

Under ideal and steady-state operations, let the impedance provided by the first switch 126, the second switch 131, and the capacitor 130 be represented as shown in Equation 1:

$$\frac{1}{f_T C} = \alpha Rref \qquad \text{Equation 1}$$

In Equation 1, as defined earlier, $f_T$ is the target frequency, and further C is the capacitance of the capacitor 130; accordingly, the total impedance achieved by the switched path and capacitor is stated to be in terms of the parallel resistance of the first resistor 134 and a multiplier or factor, α. Stated alternatively, if both sides of Equation 1 are divided by Rref, then α is proportional (inversely) to the impedance of the feedback controlled voltage stage, that is, responsive to each of Rref, C, and the target frequency $f_T$.

V1, the voltage across the switched resistor network 122, can be expressed under Ohms Law as in the following Equation 2:

$$V1 = I1 \times \frac{Rref \times 1/f_T C}{Rref + 1/f_T C} \qquad \text{Equation 2}$$

Next, substituting Equation 1 into Equation 2, gives Equation 3:

$$V1 = I1 \times \frac{Rref \times \alpha Rref}{Ref + \alpha Rref} \qquad \text{Equation 3}$$

When Rref is influenced by a resistance-impacting factor(s), the total changed resistance can be indicated as Rref+ΔRref. Accordingly, when such a change occurs, the V1 also changes by ΔV1, which can be expressed by substituting the change in Rref into Equation 3, giving Equation 4:

$$\text{Equation 4}$$
$$V1 + \Delta V1 = I1 \times \frac{Rref\left(1 + \frac{\Delta Rref}{Rref}\right) \times 1/f_T C}{Rref\left(1 + \frac{\Delta Rref}{Rref}\right) + 1/f_T C} I1 \times \frac{Rref\left(1 + \frac{\Delta Rref}{Rref}\right) \times \alpha Rref}{Rref\left(1 + \frac{\Delta Rref}{Rref}\right) + \alpha Rref}$$

Dividing the Equation 4 numerator and denominator by Rref gives Equation 5:

$$\text{Equation 5}$$
$$V1 + \Delta V1 = I1 \times \frac{Rref\left(1 + \frac{\Delta Rref}{Rref}\right) \times \alpha}{1 + \frac{\Delta Rref}{Rref} + \alpha} = I1 \times \frac{\alpha Rref\left(1 + \frac{\Delta Rref}{Rref}\right)}{1 + \frac{\Delta Rref}{Rref} + \alpha}$$

Equation 5 can be rewritten by multiplying I1 in the numerator and factoring (1+α) from the denominator, as shown in Equation 6:

$$V1 + \Delta V1 = \frac{I1 \alpha Rref\left(1 + \frac{\Delta Rref}{Rref}\right)}{(1 + \alpha)\left(1 + \frac{1}{(1 + \alpha)} \frac{\Delta Rref}{Rref}\right)} \qquad \text{Equation 6}$$

Rearranging Equation 6 gives Equation 7:

$$V1 + \Delta V1 = \frac{\alpha}{(1 + \alpha)} \times I1 \times Rref \times \frac{\left(1 + \frac{\Delta Rref}{Rref}\right)}{\left(1 + \frac{1}{(1 + \alpha)} \frac{\Delta Rref}{Rref}\right)} \qquad \text{Equation 7}$$

For a variable v having an absolute value less than one, an approximation may be provided by Equation 8:

$$\frac{1}{(1 + v)} \approx 1 - v \qquad \text{Equation 8}$$

Using the Equation 8 approximation with $$v = \frac{1}{(1 + \alpha)} \frac{\Delta Rref}{Rref},$$

that is, assuming that value is less than one, and substituting the approximation into Equation 7, gives Equation 9:

$$V1 + \Delta V1 = \qquad \text{Equation 9}$$
$$\frac{\alpha}{(1 + \alpha)} \times I1 \times Rref \times \left[1 + \frac{\Delta Rref}{Rref}\right]\left[1 - \frac{1}{(1 + \alpha)} \frac{\Delta Rref}{Rref}\right]$$

Equation 9 may be rewritten by ignoring the negligible square valued $$\left(\frac{\Delta Rref^2}{Rref^2}\right)$$

of an already-small number, as in the following Equation 10:

$$V1 + \Delta V1 = \qquad \text{Equation 10}$$
$$\frac{\alpha}{(1 + \alpha)} \times I1 \times Rref \times \left[1 + \frac{\Delta Rref}{Rref} - \frac{1}{(1 + \alpha)} \frac{\Delta Rref}{Rref}\right]$$

In Equation 10, a common denominator may be provided for the second term in the square bracket, as shown in Equation 11:

$$V1 + \Delta V1 = \qquad \text{Equation 11}$$
$$\frac{\alpha}{(1 + \alpha)} \times I1 \times Rref \times \left[1 + \frac{(\Delta Rref)(1 + \alpha)}{(Rref)(1 + \alpha)} - \frac{1}{(1 + \alpha)} \frac{\Delta Rref}{Rref}\right]$$

In Equation 11, combining like terms results in Equation 12

$$V1 + \Delta V1 = \frac{\alpha}{(1 + \alpha)} \times I1 \times Rref \times \left[1 + \frac{\alpha}{(1 + \alpha)} \frac{\Delta Rref}{Rref}\right] \qquad \text{Equation 12}$$

Next, from Equation 12, by distributing the multiplier $$\frac{\alpha}{(1 + \alpha)} \times I1 \times Rref$$

into each of the addends in the square brackets, gives Equation 13:

$$V1 + \Delta V1 = \frac{\alpha}{(1+\alpha)} \times I1 \times Rref + \left[\left(\frac{\alpha}{(1+\alpha)}\right)^2 \frac{\Delta Rref}{Rref}\right] \times I1 \times Rref \quad \text{Equation 13}$$

Notably in Equation 13, there are two addends, and the first is based solely on I1, Rref, and α, that is, all attributes of the feedback-controlled voltage stage 106, that is, the current through it, the resistance of the first resistor 134, and the effect on resistance from α, which recall is defined in Equation 1. Accordingly, the first addend in Equation 13 mathematically describes how each of those factors impacts V1, and further then the second addend, which includes the resistance-impacted ΔRref of Equation 13, mathematically describes how each of those factors impacts ΔV1. In other words, Equation 13 can be separated into its constituent addends, as shown in Equations 14 and 15:

$$V1 = \frac{\alpha}{(1+\alpha)} \times I1 \times Rref \quad \text{Equation 14}$$

$$\Delta V1 = \left[\left(\frac{\alpha}{(1+\alpha)}\right)^2 \frac{\Delta Rref}{Rref}\right] \times I1 \times Rref = \left[\left(\frac{\alpha}{(1+\alpha)}\right)^2\right] \times \Delta Rref \times I1 \quad \text{Equation 15}$$

Having derived V1 and ΔV1, a related analysis is provided to derive V3 and ΔV3. In steady state (without the impact of resistance-impacting factors), V3 may be stated in terms of the voltage V2 at the fifth node 156, plus the voltage in the first parallel resistance network 138 as generated by the current I2, as shown mathematically in Equation 16:

$$V3 = V2 + \frac{\alpha Rref \times Rref}{\alpha Rref + Rref} \times I2 \quad \text{Equation 16}$$

In Equation 16, the resistance α Rref is that of the fourth resistor 148. Further, Equation 1 defines α, so by that definition the nominal resistance of the fourth resistor 148 is equal to $$\frac{1}{f_T C}.$$

Equation 16 may be rewritten by factoring out Rref, as in Equation 17:

$$V3 = V2 + \left(\frac{\alpha}{\alpha+1}\right) \times Rref \times I2 \quad \text{Equation 17}$$

As described earlier, however, Rref also changes in response to the resistance-impacting factors. Accordingly, just as V1 changes by ΔV1 and V3 changes by ΔV3 to such factors, likewise Rref may be stated to change, as comparably shown in Equation 18:

$$Rref = Rref + \Delta Rref = Rref\left(1 + \frac{\Delta Rref}{Rref}\right) \quad \text{Equation 18}$$

The Equation 18 change in Rref will give rise to a corresponding change in V3, that is, to provide ΔV3, so Equation 18 can be used to establish the entirety of both V3 and ΔV3, by substituting the resistance-impacted Rref of Equation 18 into Equation 18, giving Equation 19:

$$V3 + \Delta V3 = V2 + \left(\frac{\alpha}{\alpha+1}\right) \times Rref\left(1 + \frac{\Delta Rref}{Rref}\right) \times I2 \quad \text{Equation 19}$$

By distributing $$\left(\frac{\alpha}{\alpha+1}\right) \times Rref$$

in Equation 19, gives Equation 20:

$$V3 + \Delta V3 = V2 + \left[\left(\frac{\alpha}{\alpha+1}\right) \times Rref \times I2\right] + \left[\left(\frac{\alpha}{\alpha+1}\right) \times I2 \times \Delta Rref\right] \quad \text{Equation 20}$$

In Equation 20, as was the case earlier for Equation 13, there is an addend influenced by ΔRref and two others that are not, so that Equation 13 also can be separated into a nominal portion for V3 and a resistance-impacted portion for ΔV3, as shown in Equations 21 and 22:

$$V3 = V2 + \left[\left(\frac{\alpha}{\alpha+1}\right) \times Rref \times I2\right] \quad \text{Equation 21}$$

$$\Delta V3 = \left[\left(\frac{\alpha}{\alpha+1}\right) \times I2 \times \Delta Rref\right] \quad \text{Equation 22}$$

The preceding Equation 15 provides ΔV1, and the preceding Equation 22 provides ΔV3. Recall also that the oscillator configuration 100 is configured so that the two differential voltages, ΔV1 and ΔV3, offset each other (i.e., ΔV1=ΔV3). With the oscillator configuration 100, the preceding can then be solved to provide an appropriate relationship between the currents I1 and I2, so as to maintain the voltage offset condition. Particularly, proper offset is achieved when ΔV1=ΔV3, which can be mathematically described by setting equal the values in Equations 15 and 22, shown in Equation 23:

$$\left[\left(\frac{\alpha}{(1+\alpha)}\right)^2\right] \times \Delta Rref \times I1 = \left[\left(\frac{\alpha}{\alpha+1}\right) \times I2 \times \Delta Rref\right] \quad \text{Equation 23}$$

Cancelling out the common factors in Equation 23 gives the desired relationship between the currents I1 and I2, shown in Equation 24:

$$\left(\frac{\alpha}{(1+\alpha)}\right) \times I1 = I2 \quad \text{Equation 24}$$

From Equation 24, and returning to FIG. 1, the desired relationship of I1 and I2 can be achieved by selecting the device parameters (e.g., transistor width and/or length) of the current mirror reference transistor 110 and the first MOS transistor 120. For example, for $f_T$=32 MHz, then as other examples C=2 pF, Rref=20 kOhms, transistor width=10 μm and transistor length=1 μm.

Additionally, the preceding also provides a foundation for determining the appropriate setpoint for the voltage V2. Particularly, Equation 24 relates I1 and I2 with a goal to achieve, or approximate, ΔV1=ΔV3, and at the same time, also desired is the reduction of error signal to the error amplifier 114, that is, also desired is achieving, or approximating along with feedback correction, that V1=V3. Also with the oscillator configuration 100, this latter goal can be directed by setting equal the values of Equations 14 and 21, as shown in the following Equation 25:

$$\frac{\alpha}{(1+\alpha)} \times I1 \times Rref = V2 + \left[\left(\frac{\alpha}{\alpha+1}\right) \times I2\right] \qquad \text{Equation 25}$$

The value of I2 in Equation 25 may be replaced with that shown in Equation 24, as shown in Equation 26:

$$\frac{\alpha}{(1+\alpha)} \times I1 \times Rref = V2 + \left[\left(\frac{\alpha}{\alpha+1}\right) \times Rref \times \left(\frac{\alpha}{(1+\alpha)}\right) \times I1\right] \qquad \text{Equation 26}$$

Next, Equation 26 may be partially solved for V2, as shown in Equation 27:

$$V2 = \frac{\alpha}{(1+\alpha)} \times I1 \times Rref - \left[\left(\frac{\alpha}{\alpha+1}\right) \times I1 \times Rref\right] \qquad \text{Equation 27}$$

Equation 27 may be further reduced by factoring the common term $$\frac{\alpha}{(1+\alpha)},$$

as shown in Equation 28:

$$V2 = \frac{\alpha}{(1+\alpha)}\left[1 - \left(\frac{\alpha}{1+\alpha}\right)\right] \times I1 \times Rref \qquad \text{Equation 28}$$

Equation 28 may be further reduced by providing a common denominator and reducing terms, to Equation 29:

$$V2 = \frac{\alpha}{(1+\alpha)^2} \times I1 \times Rref \qquad \text{Equation 29}$$

Accordingly, Equation 29 provides an indication of the desired setting for V2 at the fifth node 156, as may be achieved by adjusting the variable resistor 144. For example, the manufacturer of the oscillator configuration 100 can adjust (trim) the variable resistor 144 such that $f_T$ is achieved at room temperature. Accordingly, V2 serves as a variable offset voltage to combine with the voltage across the first parallel resistance network 138, so as to adapt V3 consistent with the above teachings.

FIG. 2 is a simulation graph 200 representing an example of potential improvement by the oscillator configuration 100. The simulation graph 200 illustrates Rref on its horizontal axis and $f_T$ on its vertical axis. The simulation graph 200 also includes two plots, namely, an uncompensated frequency response curve 202 and an adaptive-reference voltage compensated frequency response curve 204. Generally, the uncompensated frequency response curve 202 represents potential frequency response of an oscillator as may be observed in the prior art, where it has a reference resistor (akin to Rref) that ideally provides a same, or within-tolerance, amount of resistance, but is otherwise susceptible to resistance-impacting factors, for example any one or more of temperature, aging, and packaging stress. Accordingly, as Rref varies for the uncompensated frequency response curve 202, then the output target frequency $f_T$ of the corresponding oscillator also varies. Indeed, in the illustrated example, an approximate 12.5% variation in Rref results in a +/−5% variation in $f_T$. In contrast, as Rref varies for the adaptive-reference voltage compensated frequency response curve 204, again in the illustrated example for an approximate 12.5% variation in Rref, the adaptive offset from the adaptive-reference voltage stage 108 results in a +/−0.1% variation in $f_T$, meaning an improvement of a factor of approximately 50, resulting in a relatively very accurate clock frequency generation.

From the above, described examples provide an integrated circuit that includes an oscillator configuration 100 for producing a clock signal at a target frequency $f_T$. The oscillator includes a feedback-controlled voltage stage 106 and an adaptive-reference voltage stage 108. The adaptive-reference voltage stage 108 includes circuitry that adjusts a reference voltage to compensate for non-idealities that occur in the feedback controlled voltage from the feedback-controlled voltage stage 106. For example, the adaptive-reference voltage stage circuitry may include one or more of a variable offset voltage V2 and one or more resistors selected based on resistance in the feedback-controlled voltage stage, and further based on other impedance affecting factors in that stage, for example include capacitance and target frequency when a switched resistance is included in that stage. Accordingly, the oscillator may provide benefits over a prior art oscillator. One benefit is for the adaptive circuitry to track the impact of certain factors on the feedback-controlled voltage stage 106, where the tracking provides an offset so that any effect of those factors on oscillator target frequency are mitigated. Another benefit is outputting the clock signal with reduced variation in the target frequency, even under certain conditions that may affect the impedance of the feedback-controlled voltage stage, other than the feedback of the oscillator frequency to that stage. Such conditions may include, as examples, IC temperature, package stress, and age, and possibly others. Other benefits include variations and modifications to the structure, where certain examples have been provided. Accordingly, additional modifications are possible in the described embodiments, and other examples are possible, within the scope of the following claims.

What is claimed is:

1. An integrated circuit, comprising:
   an error amplifier having a first input, a second input, and an output;
   a voltage controlled oscillator having an input coupled to the output of the error amplifier and an output;
   a feedback controlled voltage stage having at least one control input coupled to the output of the voltage controlled oscillator and an output coupled to the first input of the error amplifier; and
   an adaptive-reference voltage stage coupled to the second input of the error amplifier, wherein the adaptive-reference voltage stage includes resistor network circuitry having a resistance proportional to an impedance of the feedback controlled voltage stage.

2. The integrated circuit of claim 1, wherein the adaptive-reference voltage stage includes circuitry for providing a variable reference voltage.

3. The integrated circuit of claim 1, wherein the adaptive-reference voltage stage includes trimming circuitry for providing a variable reference voltage.

4. The integrated circuit of claim 1, wherein the impedance of the feedback controlled voltage stage is responsive to a target frequency of an output signal from the voltage controlled oscillator.

5. The integrated circuit of claim 4:
wherein the feedback controlled voltage stage includes a resistance and capacitance; and
wherein the impedance of the feedback controlled voltage stage is further responsive to the resistance and the capacitance.

6. The integrated circuit of claim 1, wherein the feedback controller voltage stage includes at least one switch adapted to receive an output signal from the voltage controlled oscillator, wherein the impedance of the feedback controlled voltage stage is responsive to a frequency of the output signal.

7. The integrated circuit of claim 1, wherein the feedback controlled voltage stage includes a switched impedance in parallel with a first resistor.

8. The integrated circuit of claim 7, wherein the impedance of the feedback controlled voltage stage is responsive to a switching frequency of the switched impedance in parallel with the first resistor.

9. The integrated circuit of claim 7, wherein the resistor network circuitry includes a second resistor matched with the first resistor.

10. The integrated circuit of claim 9, wherein the resistor network circuitry includes a third resistor in parallel with the second resistor.

11. The integrated circuit of claim 10, wherein the third resistor has a resistance responsive to resistance of the second resistor and the impedance of the feedback controlled voltage stage.

12. The integrated circuit of claim 1, further including a filter coupled between the output of the feedback controlled voltage stage and the first input of the error amplifier.

13. The integrated circuit of claim 1, wherein the feedback controlled voltage stage includes a switched resistance circuit having an equivalent impedance responsive to a frequency of an output signal from the voltage controlled oscillator.

14. The integrated circuit of claim 1, further including current mirroring circuitry adapted to couple a first current to the feedback controlled voltage stage and a second current to the adaptive-reference voltage stage.

15. The integrated circuit of claim 14, wherein the second current is proportional to the first current times a factor, the factor responsive to an impedance of the feedback controlled voltage stage.

16. The integrated circuit of claim 15, wherein the impedance of the feedback controlled voltage stage is responsive to a target frequency of an output signal from the voltage controlled oscillator.

17. The integrated circuit of claim 16, wherein the impedance of the feedback controlled voltage stage is further responsive to a resistance and a capacitance of the feedback controlled voltage stage.

18. The integrated circuit of claim 1, further comprising:
a divider having an input connected to the output of the voltage controller oscillator, and an output connected to the at least one control input of the feedback controlled voltage stage.

19. A method of operating an integrated circuit, comprising:
operating an error amplifier to output a drive signal to a voltage controlled oscillator;
operating the voltage controlled oscillator to output an output signal having a frequency to control an impedance of a feedback controlled voltage stage;
operating the feedback controlled voltage stage to output a frequency-dependent voltage to a first input of the error amplifier; and
operating an adaptive-reference voltage stage to output an adaptive reference voltage level to a second input of the error amplifier, wherein the adaptive reference voltage level tracks a temperature induced change in the frequency-dependent voltage, and wherein the adaptive-reference voltage stage includes resistor network circuitry having a resistance proportional to an impedance of the feedback controlled voltage stage.

20. The method of claim 19, wherein the feedback controlled voltage stage includes a switched impedance in parallel with a resistor, and wherein the switched impedance is controlled by the output signal from the voltage controller oscillator so as to cause the feedback controller voltage stage to output the frequency-dependent voltage.

* * * * *